(12) United States Patent
Najjari et al.

(10) Patent No.: US 12,185,498 B2
(45) Date of Patent: Dec. 31, 2024

(54) MODULAR, TWO-PHASE COOLING SYSTEMS

(71) Applicant: CoolIT Systems, Inc., Calgary (CA)

(72) Inventors: Mohammad Reza Najjari, Calgary (CA); Cameron S. Turner, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 0 days.

(21) Appl. No.: 18/297,561

(22) Filed: Apr. 7, 2023

(65) Prior Publication Data

US 2023/0328927 A1     Oct. 12, 2023

Related U.S. Application Data

(60) Provisional application No. 63/329,855, filed on Apr. 11, 2022.

(51) Int. Cl.
*H05K 7/20*     (2006.01)

(52) U.S. Cl.
CPC ..... *H05K 7/20327* (2013.01); *H05K 7/20318* (2013.01); *H05K 7/20809* (2013.01)

(58) Field of Classification Search
CPC .............. H01L 23/473; F28D 15/0266; H05K 7/20781; H05K 7/20772; H05K 7/20272;

(Continued)

(56) References Cited

U.S. PATENT DOCUMENTS

| | | |
|---|---|---|
| 6,948,556 B1 | 9/2005 | Anderson et al. |
| 6,990,816 B1 | 1/2006 | Zuo et al. |

(Continued)

FOREIGN PATENT DOCUMENTS

| | | |
|---|---|---|
| AU | 2016381502 A1 | 7/2018 |
| CA | 3009924 A1 | 7/2017 |

(Continued)

OTHER PUBLICATIONS

PCT International Search Report in PCT/IB2023/053638, mailed Jul. 24, 2023.

(Continued)

*Primary Examiner* — Mandeep S Buttar
(74) *Attorney, Agent, or Firm* — WORKMAN NYDEGGER

(57) ABSTRACT

Active two-phase cooling systems incorporate a cooling medium that changes phase as it absorbs heat dissipated by a heat source and a pump or a compressor that urges the cooling medium through a cooling loop. Operation of some heat sources, e.g., electronic devices, can improve if maintained at a substantially uniform operating temperature. A cooling medium can enter a node for cooling such a heat source at or near a saturation state and can exhaust from the node as a saturated mixture, providing a substantially uniform temperature across the node while taking advantage of the cooling medium's relatively high latent-heat of phase-change to provide a high rate of cooling to the heat source. Although counterintuitive, a cooling loop can pre-heat a sub-cooled flow of the cooling medium to provide the medium to the node in a saturated state. Such pre-heating can be achieved by the saturated mixture of the cooling medium after exhausting from the node.

9 Claims, 8 Drawing Sheets

(58) Field of Classification Search
CPC ........... H05K 7/20809; H05K 7/20318; H05K 7/20327; H05K 7/20254; H05K 7/20263; H05K 5/067; H05K 7/20281; H05K 7/20309; H05K 7/20381; H05K 7/20836; F28F 2250/08; G06F 1/20; G06F 2200/201
USPC ................................................... 361/679.53
See application file for complete search history.

(56) References Cited

U.S. PATENT DOCUMENTS

| | | | |
|---|---|---|---|
| 8,002,021 | B1 | 8/2011 | Zuo et al. |
| 10,215,501 | B1 | 2/2019 | Reist et al. |
| 10,638,639 | B1 | 4/2020 | Garner et al. |
| 10,687,441 | B2 | 6/2020 | Parnes et al. |
| 2005/0039888 | A1 | 2/2005 | Pfahnl et al. |
| 2007/0044493 | A1* | 3/2007 | Kearney ............... F25B 41/35 236/92 B |
| 2008/0259566 | A1* | 10/2008 | Fried ................. H05K 7/20809 165/80.4 |
| 2011/0056225 | A1* | 3/2011 | Campbell .......... H05K 7/20381 62/223 |
| 2013/0025818 | A1* | 1/2013 | Lyon ................. H05K 7/20781 165/181 |
| 2015/0189796 | A1 | 7/2015 | Shedd et al. |
| 2016/0118317 | A1 | 4/2016 | Shedd et al. |
| 2017/0064874 | A1 | 3/2017 | Lyon et al. |
| 2018/0317344 | A1 | 11/2018 | Parnes et al. |
| 2019/0061470 | A1* | 2/2019 | Koberstein ........ B60H 1/00392 |
| 2020/0052356 | A1 | 2/2020 | Eadelson |
| 2020/0113085 | A1* | 4/2020 | Schon .................... F25D 17/02 |
| 2020/0163254 | A1* | 5/2020 | Eadelson .......... H05K 7/20327 |
| 2020/0166246 | A1 | 5/2020 | Eadelson |
| 2021/0180874 | A1 | 6/2021 | Eadelson |
| 2022/0412624 | A1* | 12/2022 | Vaisman ................ F25B 41/20 |

FOREIGN PATENT DOCUMENTS

| | | |
|---|---|---|
| CA | 3055897 A1 | 9/2018 |
| CA | 3056338 A1 | 9/2018 |
| CA | 3070836 A1 | 1/2019 |
| CA | 3081814 A1 | 5/2019 |
| CA | 3145520 A1 | 1/2021 |
| CN | 107182191 A | 9/2017 |
| CN | 108781523 A | 11/2018 |
| CN | 110770522 A | 2/2020 |
| CN | 110770964 A | 2/2020 |
| CN | 111263878 A | 6/2020 |
| CN | 111512110 A | 8/2020 |
| CN | 114175360 A | 3/2022 |
| EP | 3398414 A1 | 11/2018 |
| EP | 3593400 A1 | 1/2020 |
| EP | 3596417 A1 | 1/2020 |
| EP | 3658836 A1 | 6/2020 |
| EP | 3707454 A1 | 9/2020 |
| IL | 260284 A | 7/2018 |
| IL | 269230 A | 11/2019 |
| IL | 269234 A | 11/2019 |
| IL | 272197 A | 3/2020 |
| IL | 274479 A | 6/2020 |
| IL | 288625 A | 2/2022 |
| JP | 2019507303 A | 3/2019 |
| KR | 20180118615 A | 10/2018 |
| TW | 201247089 A | 11/2012 |
| TW | 201320883 A | 5/2013 |
| WO | 2017115359 A1 | 7/2017 |
| WO | 2018163180 A1 | 9/2018 |
| WO | 2018167773 A1 | 9/2018 |
| WO | 2019/015407 A1 | 1/2019 |
| WO | 2019021273 A1 | 1/2019 |
| WO | 2019087195 A1 | 5/2019 |
| WO | 2021014441 A1 | 1/2021 |
| WO | 2022/012302 A1 | 1/2022 |

OTHER PUBLICATIONS

HYPERCOOL Direct Contact Evaporative Cooling In-Rack Solution, www.zutacore.com, dated May 20, 2020.
Office Action received for Taiwan Patent Application No. 112113271, mailed on Apr. 9, 2024, 5 pages.

* cited by examiner

HX Condenser: Refrigerant to PG

MODULAR, TWO-PHASE COOLING SYSTEMS

FIELD

This application and the subject matter disclosed herein (collectively referred to as the "disclosure") generally concern systems configured to transfer heat from one medium to another medium, and more particularly but not exclusively, to modularly configured systems for removing heat from a source that must operate at or below a threshold temperature, e.g., electronic components. For example, some disclosed systems incorporate a coolant that changes phase as it absorbs heat dissipated by an electronic component.

BACKGROUND INFORMATION

Many consumer and industrial devices require cooling to function as intended. For example, new generations of electronic components, such as, for example, memory components, microprocessors, graphics processors, and power electronics semiconductor devices, produce increasing amounts of heat during their operation. If the heat is not removed at a sufficient rate, the components can overheat, decreasing performance, reliability, or both, and in some cases component damage or failure.

Electronic devices, such as, for example, servers, computers, game consoles, power electronics, communications and other networking devices, batteries, and so on, can use air cooling, liquid cooling (e.g., involving a single-phase of liquid coolant), or a combination of both, to transfer and dissipate heat from electronic components to an ultimate heat sink, e.g., the atmosphere.

Conventional air cooling relies on natural convection or uses forced convection (e.g., a fan mounted near a heat producing component) to replace heated air with cooler ambient air around the component. Such air-cooling techniques can be supplemented with a conventional "heat sink," which often is a plate of a thermally conductive material (e.g., aluminum or copper) placed in thermal contact with the heat-producing component. The heat sink can spread heat from the component to a larger area for dissipating heat to the surrounding air. Some heat sinks include "fins" to further increase the surface area available for heat transfer and thereby to improve the transfer of heat to the air. Some heat sinks include a fan to force air among the fins and are commonly referred to in the art as "active" heat sinks.

Liquid cooling improves cooling performance compared to air cooling techniques described above, as many liquids, e.g. water, have significantly better heat transfer capabilities than air. FIG. 1 illustrates various components of a liquid cooling loop 5. The cooling loop 5 typically operates by (1) transferring heat, $\dot{Q}_{in}$, from a heat-generating electronic component (not shown) to a cool liquid passing through a heat exchanger 1 (sometimes referred to in the art as a "cold-plate" or a "heat sink") placed in thermal contact with the heat-generating component, (2) transporting the heat absorbed by the liquid to a remote radiator 2, or heat rejector (sometimes referred to in the art generally as a "heat exchanger," or a "liquid-to-liquid heat exchanger" if the heat is rejected to another liquid or a "liquid-to-air heat exchanger" if the heat is rejected to air), (3) dissipating the heat, $\dot{Q}_{out}$, from the remote radiator to another medium (e.g., air or facility water passing through the remote radiator), and (4) returning cooled liquid to the heat exchanger (or heat sink). A pump 3 urges the liquid coolant through the cooling loop 5.

SUMMARY

In some respects, concepts disclosed herein generally concern modular, two-phase cooling systems. Such systems can be used to maintain a temperature of an apparatus below a threshold temperature. For example, electronic components, exothermic reaction chambers and other sources of heat often maintain a temperature below a threshold temperature to function as intended. Some disclosed concepts pertain to systems, methods, and components for providing such multi-phase cooling (e.g., involving a coolant that changes phase as it absorbs or rejects heat). The principles disclosed herein overcome many problems in the prior art and address one or more of the aforementioned or other needs.

Two-phase coolant loops for cooling one or more heat-generating components are disclosed. According to a first aspect, a two-phase coolant loop includes a pump configured to urge a coolant to circulate through the coolant loop and a distribution manifold fluidly coupled with the pump to receive the coolant from the pump. A plurality cooling branches fluidly couple with the manifold to receive the coolant from the distribution manifold. Each branch has a flow-regulator and a cooling node configured to transfer heat from a heat source to the coolant passing through the corresponding cooling branch. Each flow-regulator limits a flow-rate of coolant through the corresponding branch, proportionately balancing a flow-rate of coolant among the plurality of cooling branches. The coolant passing through at least one of the cooling nodes boils, generating a saturated mixture of vapor-phase and liquid-phase coolant. A collection manifold fluidly couples with each in the plurality of cooling branches to receive a flow of heated coolant in a liquid-phase or a saturated mixture of vapor-phase and liquid-phase from each of the cooling branches and to combine the received flows into a flow of heated coolant. A condenser fluidly couples with the collection manifold to receive the flow of heated coolant. The condenser is configured to reject heat from the heated coolant and to condense the heated coolant to a sub-cooled liquid phase. The two-phase coolant loop also includes a fluid coupling from the condenser to the pump such that the pump is configured to receive the sub-cooled liquid phase of coolant.

At least one of the heat-generating components can be a server and the heat source can be a heat-generating electronic device in the server. At least one of the cooling branches can extend into, through, and out-from the server. The cooling node corresponding to the at least one the cooling branches can be a cold plate configured to receive heat generated by the heat-generating electronic device.

In some embodiments, the heat-generating electronic device comprises a processing unit, a memory device, or both.

At least one of the heat-generating components can be a plurality of rack-mounted servers. Each server in the plurality of rack-mounted servers can have one or more heat-generating electronic devices, and at least one of the cooling branches can extend into, through, and out from one or more of the servers. The cooling node corresponding to the at least one of the cooling branches can be a cold plate configured to receive heat generated by at least one of the one or more heat-generating electronic devices corresponding to each of the one or more of the servers. In some embodiments, the at least one of the cooling branches is a plurality of cooling branches, and each of the plurality of cooling branches can extend into, through, and out—from a corresponding one of the plurality of rack-mounted servers.

In some embodiments, the least one of the heat-generating components includes a plurality of rack-mounted servers and the heat source can include a secondary cooling loop configured to remove heat from the plurality of rack-mounted servers by circulating a secondary cooling medium through the secondary cooling loop. The coolant in the two-phase cooling loop can be a primary cooling medium and the cooling node configured to transfer heat from the heat source can be an evaporator configured to transfer heat from the secondary cooling medium to the primary cooling medium.

In some embodiments, at least one of the heat-generating components includes a server having one or more heat-generating electronic devices, and the heat source includes a secondary cooling loop configured to remove heat from the one or more heat-generating electronic devices by circulating a secondary cooling medium through the secondary cooling loop. The coolant can be a primary cooling medium and the cooling node configured to transfer heat from the heat source can include an evaporator configured to transfer heat from the secondary cooling medium to the primary cooling medium.

According to a second aspect, the coolant loop includes a compressor configured to urge a flow of coolant to circulate through the coolant loop. The coolant loop also includes a condenser fluidly coupled with the compressor to receive the flow of coolant from the compressor. The condenser is configured to reject heat from the coolant and to condense the heated coolant to a sub-cooled liquid phase. The coolant loop also includes an expansion valve and a fluid coupling from the condenser to the expansion valve such that the expansion valve is configured to receive condensed coolant. The expansion valve is configured to adjust a pressure of the condensed coolant to a saturation pressure. A distribution manifold fluidly couples with the expansion valve to receive the saturated coolant from the expansion valve. A plurality cooling branches fluidly couple with the manifold to receive the coolant from the distribution manifold. Each branch has a flow-regulator and a cooling node configured to transfer heat from a heat source to the saturated coolant passing through the corresponding cooling branch. Each flow-regulator limits a flow-rate of saturated coolant through the corresponding branch, proportionately balancing a flow-rate of saturated coolant among the plurality of cooling branches. The coolant exhausts from each cooling node as a saturated mixture of vapor-phase and liquid-phase coolant. A collection manifold fluidly couples with each in the plurality of cooling branches to receive a flow of heated coolant from each of the cooling branches and to combine the received flows into a flow of heated coolant. The coolant loop also includes a fluid coupling from the collection manifold to the compressor such that the compressor is configured to receive flow of heated coolant.

In an embodiment according to the second aspect, at least one of the heat-generating components can be a server and the heat source can be a heat-generating electronic device in the server. At least one of the cooling branches can extend into, through, and out-from the server, and the cooling node corresponding to the at least one the cooling branches can include a cold plate configured to receive heat generated by the heat-generating electronic device.

The heat-generating electronic device can include a processing unit, a memory device, or both.

At least one of the heat-generating components can include a plurality of rack-mounted servers. Each server the plurality of rack-mounted servers can have one or more heat-generating electronic devices, and at least one of the cooling branches extends into, through, and out from one or more of the servers. The cooling node corresponding to the at least one of the cooling branches can include a cold plate configured to receive heat generated by at least one of the one or more heat-generating electronic devices corresponding to each of the one or more of the servers.

The at least one of the cooling branches can be a plurality of cooling branches, and each of the plurality of cooling branches can extend into, through, and out-from a corresponding one of the plurality of rack-mounted servers.

At least one of the heat-generating components can include a plurality of rack-mounted servers and the heat source can be a secondary cooling loop configured to remove heat from the plurality of rack-mounted servers by circulating a secondary cooling medium through the secondary cooling loop. The coolant can be a primary cooling medium and the cooling node configured to transfer heat from the heat source can include an evaporator configured to transfer heat from the secondary cooling medium to the primary cooling medium.

At least one of the heat-generating components can be a server having one or more heat-generating electronic devices, and the heat source can include a secondary cooling loop configured to remove heat from the one or more heat-generating electronic devices by circulating a secondary cooling medium through the secondary cooling loop. The coolant can be a primary cooling medium and the cooling node configured to transfer heat from the heat source can include an evaporator configured to transfer heat from the secondary cooling medium to the primary cooling medium.

According to a third aspect, a two-phase coolant loop has a pump configured to urge a coolant to circulate through the coolant loop. A heat-exchanger is configured to receive the coolant in a sub-cooled state and to transfer heat to the sub-cooled coolant to increase a temperature of the sub-cooled coolant to a selected temperature. A cooling branch fluidly couples with the heat-exchanger to receive the coolant at the selected temperature from the heat-exchanger. The cooling branch has a cooling node configured to transfer heat from a heat source to the coolant passing through the corresponding cooling branch. The coolant passing through at least one of the cooling nodes boils, generating a saturated mixture of vapor-phase and liquid-phase coolant. The coolant loop also includes a first fluid coupling from the cooling node to the heat-exchanger configured to convey a selected first portion of the saturated mixture of vapor-phase and liquid-phase coolant to the heat exchanger to provide the heat transferred to the sub-cooled coolant to increase the temperature of the sub-cooled coolant to the selected temperature. The first fluid coupling is further configured to convey a residual portion of the saturated mixture of vapor-phase and liquid-phase coolant past the heat exchanger and to recombine the selected first portion of the coolant downstream of the heat exchanger with the residual portion of the coolant, providing a recombined flow of heated coolant. A condenser is configured to receive the recombined flow of heated coolant from the first fluid coupling and to reject heat from the recombined flow of heated coolant to another medium, providing a sub-cooled flow of coolant. The coolant loop also includes a second fluid coupling from the condenser to the pump, such that the pump receives the sub-cooled flow of coolant.

At least one of the heat-generating components can include a server and the heat source can include a heat-generating electronic device in the server. The cooling branch can extend into, through, and out-from the server. The cooling node can include a cold plate configured to receive heat generated by the heat-generating electronic device.

The heat-generating electronic device can include a processing unit, a memory device, or both.

At least one of the heat-generating components can include a plurality of rack-mounted servers and each server the plurality of rack-mounted servers can have one or more heat-generating electronic devices. The cooling branch can extend into, through, and out from at least one of the servers, and the cooling node can include a cold plate configured to receive heat generated by at least one of the one or more heat-generating electronic devices corresponding to the at least one of the servers.

The cooling branch can be a first cooling branch and the coolant loop can include a second cooling branch. The first cooling branch can extend into, through, and out-from a corresponding one of the plurality of rack-mounted servers and the second branch can extends into, through, and out-from a corresponding other one of the plurality of rack-mounted servers.

At least one of the heat-generating components can include a plurality of rack-mounted servers and the heat source can include a secondary cooling loop configured to remove heat from the plurality of rack-mounted servers by circulating a secondary cooling medium through the secondary cooling loop. The coolant can be a primary cooling medium and the cooling node configured to transfer heat from the heat source can include an evaporator configured to transfer heat from the secondary cooling medium to the primary cooling medium.

At least one of the heat-generating components can include a server having one or more heat-generating electronic devices, and the heat source can include at least one of the one or more heat-generating electronic devices. The other medium can be a primary cooling medium circulating through a primary cooling loop and the condenser can be configured to reject heat from the recombined flow of heated coolant to the primary cooling medium.

Also disclosed are associated methods, as well as tangible, non-transitory computer-readable media including computer executable instructions that, when executed, cause a computing environment to implement one or more methods disclosed herein. Digital signal processors embodied in software, firmware, or hardware and being suitable for implementing such instructions also are disclosed.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

Figure 1:
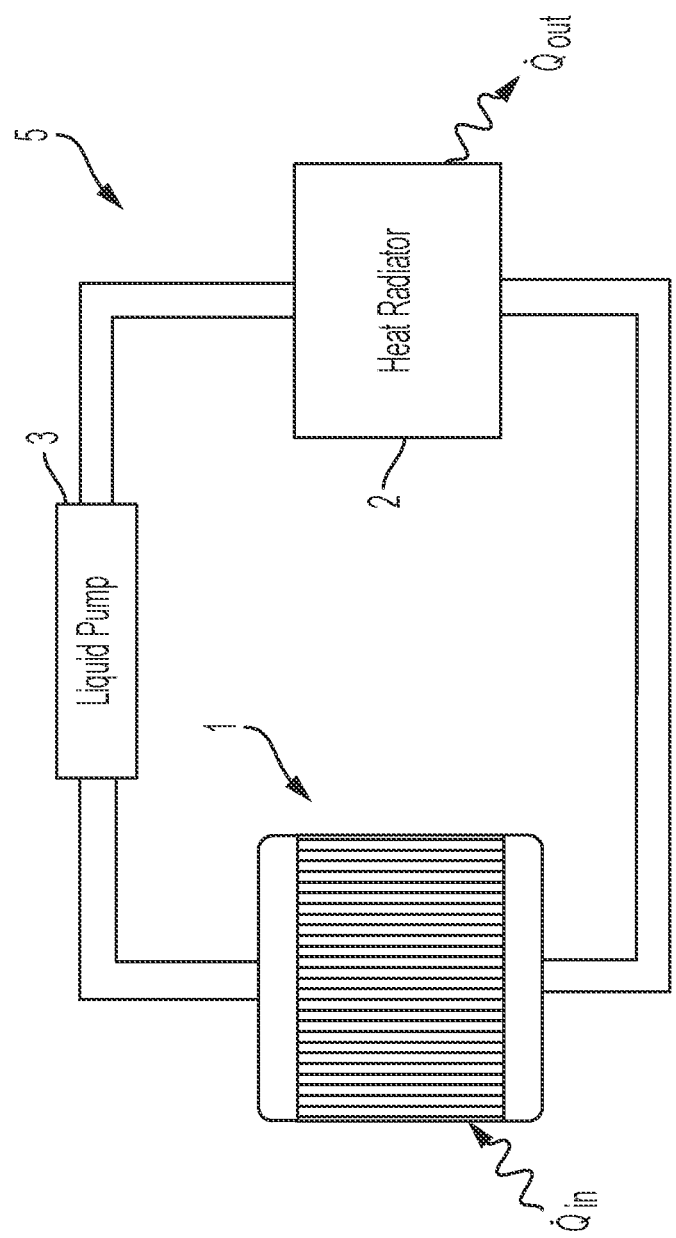
FIG. 1 schematically illustrates features of a cooling loop.

13 shows a block diagram of a computing environment suitable for implementing disclosed methods.

DETAILED DESCRIPTION

The following describes various principles related to modular, two-phase cooling systems. For example, aspects of disclosed principles pertain to components that can be assembled together in a modular fashion to provide a variety of two-phase cooling systems suitable for cooling a wide variety of heat sources found among consumer and industrial applications. Accordingly, descriptions herein of specific apparatus configurations and combinations of method acts are but particular examples of contemplated systems chosen as being convenient to illustrate disclosed principles. One or more of the disclosed principles can be incorporated in various other systems to achieve any of a variety of corresponding system characteristics. For example, specific embodiments described herein that are directed to cooling one or more electronic components can be applied to transfer heat to or from other devices (e.g., non-electronic devices, such as, for example, reactor vessels, batteries, fuel rods, etc.) found in or among a variety of other applications.

Thus, systems having attributes that are different from those specific embodiments discussed herein can embody one or more presently disclosed principles, and can be used in applications not described herein in detail. Accordingly, such alternative embodiments also fall within the scope of this disclosure.

I. Overview

A modular, two-phase cooling system can circulate coolant throughout a closed loop, absorbing heat along a segment of the loop and rejecting the absorbed heat elsewhere. For example, coolant passing through a closed loop can collect heat from one or more heat sources and carry the heat to a suitable heat sink, e.g., a radiator that rejects the heat from the coolant to a facility liquid, to atmospheric air, and/or to air in a conditioned room. The coolant can evaporate (e.g., partially or wholly evaporate) as it absorbs heat from each heat source and can condense as it rejects the heat elsewhere.

For a given mass of working fluid, a "two-phase" heat exchange module can typically absorb or reject more heat for a given change in the working fluid's temperature, and in some instances provide more suitable cooling or heating relative to a given temperature threshold, than a "single-phase" heat exchange module because the latent heat of vaporization (or condensation) of most working fluids is substantially greater than the specific heat of the fluid. For example, a single-phase fluid may change temperature in proportion to the amount of absorbed or rejected heat, whereas a fluid undergoing phase-transition typically stays within a relatively narrower range of temperature as it changes phase while it absorbs or rejects heat. Accordingly, modular, two-phase cooling systems disclosed herein are capable of absorbing a given rate of heat generated by electronic components over a relatively narrower temperature range than cooling systems that use a single-phase coolant that relies on a same flow-rate of coolant. Similarly, modular, two-phase cooling systems disclosed herein are capable of absorbing heat at a relatively higher rate for a given range of temperatures and a given coolant flow-rate than a cooling system that uses a single-phase coolant.

Various embodiments of modular, two-phase cooling systems are described. Under a first framework, disclosed embodiments circulate coolant through a loop that extends into, through, and out-from each server (or other heat-generating system). In such embodiments, a whole or partial fraction of the coolant entering a given server can evaporate as it absorbs heat passing through the server. The coolant then exits the server in a super-heated vapor-phase, a saturated vapor-phase, or as a saturated mixture of vapor-phase and liquid-phase and returns to a condenser where the absorbed heat is rejected from the coolant, condensing the vapor-phase of the coolant to the liquid-phase and possibly sub-cooling the liquid coolant below its saturation temperature.

Under a second framework, disclosed embodiments provide a primary cooling loop that extends to each server (or other heat-generating system) and a secondary cooling loop corresponding to each server. Within each server, the respective secondary cooling loop circulates a secondary coolant that evaporates (wholly or partially) as it absorbs heat from each heat-generating component (e.g., processor, GPU, memory, power-delivery component, etc.) in the server. The secondary coolant then passes through a heat-exchanger (sometimes referred to in the art as a "condenser" or a "radiator" when a refrigerant condenses), sometimes corresponding to the respective server and other times corresponding to more than one of the rack-mounted servers, rejecting the absorbed heat to the primary coolant (without mixing with the primary coolant). As the secondary coolant rejects heat to the primary coolant passing through the heat exchanger, the secondary coolant condenses to its liquid-phase and possibly sub-cools below its saturation temperature. As noted, a condenser can be associated with one or more servers in a rack. For example, a condenser can reject heat from the working fluid associated with more than one server (for example, all of them within a rack). In some embodiments, the condenser can be mounted on a rack in manner than covers a portion (e.g., a minor portion or a major portion) of a rack's face (e.g., a front face or a rear face). Alternatively, in some embodiments, a condenser can be positioned within or within a proximity of each respective server.

Also described are several alternative embodiments of coolant loops that can be used under both frameworks described above (and as either the primary coolant loop or the secondary coolant loop in the second framework). Further, embodiments of cold-plates suitable for two-phase cooling of memory also are described.

Other, related principles also are disclosed. For example, the following describes machine-readable media containing instructions that, when executed, cause a processor of, e.g., a computing environment, to perform one or more disclosed methods. Such instructions can be embedded in software, firmware, or hardware. In addition, disclosed methods and techniques can be carried out in a variety of forms of processor or controller, as in software, firmware, or hardware.

II. Framework 1: Central Two-Phase Coolant Loops

In context of cooling a plurality of heat sources, a two-phase cooling system can distribute coolant to one or more cooling nodes. Each cooling node, in turn, can facilitate a transfer of heat to the coolant as it passes through the respective cooling node, causing a portion of the coolant to evaporate as it absorbs heat. Elsewhere along the closed loop, the heated coolant (in a vapor phase or a saturated mixture of liquid-and-vapor) can reject the absorbed heat, condensing from vapor to liquid as it rejects the heat. In addition, modular, two-phase cooling systems can include other components, e.g., pumps or compressors, filters, valves, accumulators, fluid couplers, etc., that in combination provide the system with a desired measure of performance (e.g., heat-transfer capacity, energy consumption to operate, etc.).

In some embodiments, a closed loop includes a distribution manifold, a collection manifold, and one or more cooling nodes. A selected cooling node can have an inlet, an outlet, and a heat-transfer segment between the inlet and the outlet. A passageway can extend through the selected cooling node from the inlet to the outlet, passing through the heat-transfer segment. The cooling node can span from the distribution manifold to the collection manifold. For example, an inlet to the cooling node can be coupled with the distribution manifold and an outlet from the cooling node can be coupled with the collection manifold. In such an embodiment, coolant can flow into each respective cooling node through the inlet, absorb heat from one or more heat sources positioned along the respective cooling node, and exhaust from the respective cooling node through the outlet. For example, a cooling node can include a cold-plate thermally coupled with a heat source within a server and the cooling node can convey coolant into and through the confines of the server. As the coolant passes through the cooling node, the coolant can also pass through the cold-plate and absorb heat from the heat source, facilitated by the cold-plate and heat-source interface. The collection manifold, in turn, can receive the heated coolant from the cooling node and convey the heated coolant to a heat exchanger that facilitates heat transfer from heated coolant to another medium.

Figure 2:
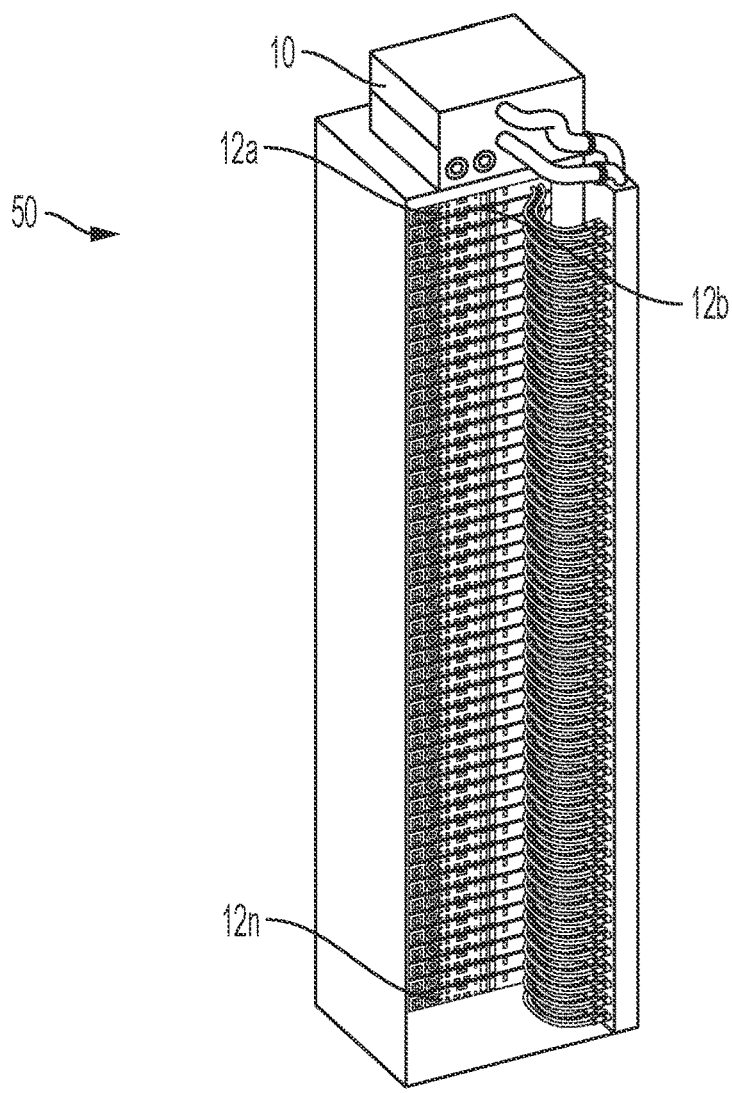
FIG. 2 illustrates a rack of servers cooled by a modular, two-phase cooling system.

By way of example, FIG. 2 shows an array 50 of independently operable servers 12a, 12b . . . 12n mounted in a rack, or chassis, together with aspects of a modular, two-phase cooling system suitable for cooling the servers. In FIG. 2, each server 12a-n contains one or more corresponding electronic components that generate heat while operating. To facilitate cooling the electronic components in each server, the illustrated cooling system 50 circulates a coolant through each server 12a-n to absorb heat generated by the electronic components. As the coolant absorbs heat from each component, the coolant changes phase from a liquid phase to a vapor phase (or to a saturated mixture of liquid-phase and vapor-phase).

The cooling system 50 can have a cooling node 11 (FIG. 3) for each server. Thus, for an installation having 42 servers, the cooling system can have 42 server-cooling nodes 11 (FIG. 3), with each server-cooling node corresponding to one of the 42 servers 12a-n in the rack. For example, the portion of the modular cooling system shown in FIG. 2 provides a server-cooling node 11 for each server 12a-n. Of course, 42 servers and 42 corresponding cooling nodes represents just one of many possible embodiments. In other embodiments, more or fewer cooling nodes than servers are provided, and principles disclosed herein can be applied to cool any number of servers or other heat-generating systems.

Figure 3:
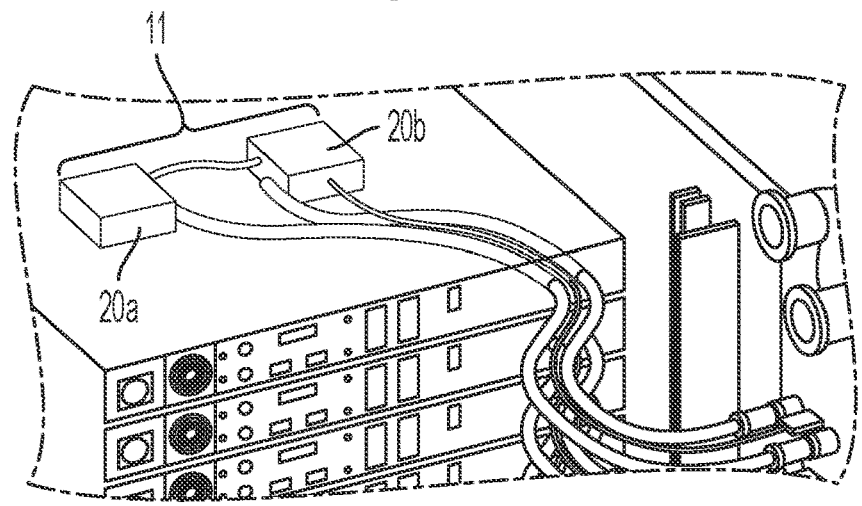
FIG. 3 schematically illustrates an embodiment of a server cooled by a modular, two-phase cooling system.

FIG. 3 shows an embodiment of a server-cooling node 11. FIG. 3 also depicts a portion (or branch) of a cooling loop, or cooling circuit, that conveys coolant to and from the server-cooling node 11, as well as to and from each component-cooling node 20a, 20b. For example, a conduit receives cool coolant from a distribution manifold and conveys the cool coolant to the server-cooling node 11 where the coolant absorbs heat. A second conduit conveys warm coolant exiting from the server-cooling node 11 to a collection manifold, which returns the warmed coolant to a coolant-distribution unit 10 (FIG. 2). In the system shown in FIGS. 2 and 3, the fluid-circuit branch for each server-cooling node is fluidically coupled in parallel with the fluid-circuit branches for each of the other server-cooling nodes.

But, within the fluid-circuit branch shown in FIG. 3, the component-cooling nodes 20a, 20b are fluidically coupled with each other in series. For example, in FIG. 3, the component cooling node 20a receives cool coolant arriving from the coolant distribution manifold and heats the coolant with heat dissipated by a first processor. After exiting the first component-cooling node 20a, coolant heated by the first processor enters the second component-cooling node 20b, where the coolant is further heated by a second processor before returning to the coolant-distribution unit 10 by way of the collection manifold. Although not shown in FIG. 3, the component-cooling nodes 20a, 20b can be fluidically coupled with each other in parallel, which each component-cooling node receiving coolant from a corresponding further branch of the coolant circuit.

A given server-cooling node 11 (or more than one of them, or all of them) can incorporate one or more component-cooling nodes. For example, if a given server has two electronic components (e.g., two processors) to be cooled by that server's server-cooling node, that server's server-cooling node can provide one component-cooling node for each electronic component to be cooled. As FIG. 3 shows, the server cooling node 11 provides a first component-cooling node 20a and a second component-cooling node 20b. The first component-cooling node 20a is thermally coupled with a first processor to transfer heat from the first processor to a coolant passing through the first component-cooling node 20a. Similarly, the second component-cooling node 20b is thermally coupled with a second processor to transfer heat from the second processor to a coolant passing through the second component-cooling node 20b.

Representative component-cooling nodes are described in further detail in U.S. Pat. Nos. 8,746,330 and 9,453,691. The disclosure in each of the immediately foregoing U.S. patents is incorporated herein in its entirety as if recited herein in full, for all purposes. The component-cooling nodes 20a, 20b can be passive, as in the '330 patent, or they can be active, e.g., include a pump, as in the '691 patent.

In some embodiments, a liquid-phase coolant (e.g., either a sub-cooled liquid-phase or a saturated liquid-phase) enters the first component-cooling node 20a and a portion of the coolant evaporates as it absorbs heat. Consequently, a saturated mixture of liquid-phase and vapor-phase coolant exhausts from the first component-cooling node 20a and enters the second component-cooling node 20b. As the saturated mixture passes through the second component-cooling node 20b, a further portion of the liquid coolant can evaporate. Consequently, a saturated mixture of coolant having a lesser fraction of liquid-phase and a corresponding higher fraction of vapor-phase can exhaust from the second component-cooling node 20b, as compared to the relative fractions of liquid-phase and vapor-phase that entered the second component-cooling node 20b.

The cooling capacity of a given cooling node depends on many parameters. But, in a general sense, the available cooling capacity corresponds to the thermodynamic state of coolant entering the cooling node, a permissible increase in coolant temperature as it passes through the cooling node, and a flow rate of coolant passing through the cooling node. With all else being equal, a cooling node with a higher mass-flow rate of coolant passing through has a higher cooling capacity than it does with a lower mass-flow rate of coolant passing through. Accordingly, a cooling node that adequately cools a heat source (e.g., an electronic component, a server, or a rack of servers) that dissipates an upper threshold rate of heat will provide excess cooling to the heat source if the rate of heat dissipation by the source falls and the mass-flow rate of coolant through the cooling node remains unchanged.

Stated differently, as the rate of heat dissipated by a heat source falls, a mass-flow rate of coolant through the corresponding cooling node can be reduced. As a consequence of reducing the flow rate through the cooling node, the pressure (or head) loss due to friction through the portion of the coolant loop corresponding to the cooling node also is reduced. With such a reduction in head loss, the source of the pressure head (e.g., the pump) that drives the coolant through that cooling node may reduce its work on the coolant and thus may operate at a reduced power. For example, if a mass-flow rate of coolant through a portion of a coolant circuit can be reduced, less pressure head may be needed to urge coolant throughout the coolant loop and so it may be possible to reduce a pump speed, in turn reducing the amount of energy consumed by the cooling system. For a given rate of heat dissipated by a heat source, a reduction in mass-flow rate of coolant through the cooling node will lead to a correspondingly higher coolant-return temperature.

Since a temperature and/or a phase of a given mass of working fluid can change as it passes through a first heat exchange module, the capacity of the given mass of working fluid to exchange heat as it passes through a second heat exchange module fluidically coupled to the first heat exchanger in series may be somewhat diminished as compared to the case in which a comparable mass of working fluid enters the second heat exchange module without being heated by the first heat exchange module (e.g., assuming a temperature of the fluid and/or the downstream heat exchanger is limited by a fixed upper threshold temperature). Nonetheless, in many instances, including many equipment cooling embodiments, such a temperature change does not appreciably diminish the cooling capacity of a downstream heat exchanger relative to the cooling requirements of the downstream heat source. For example, in many instances, a flow rate of the coolant can be increased to compensate for relatively higher rates of heat dissipation by an operable element, ensuring that a state of a working fluid within the respective cooling node 11 maintains a suitable fraction of liquid-phase before entering a downstream heat exchanger that the downstream electronic component can be adequately cooled as the liquid-phase evaporates. Similarly, for relatively lower rates of heat dissipation, a flow rate of the working fluid can be decreased to a suitable level that maintains a suitable fraction of liquid-phase while simultaneously reducing the amount of power consumed to pump the fluid through the cooling node.

Several examples of heat exchange modules are described, for example, in U.S. Patent Application No. 60/954,987, filed on Aug. 9, 2007, U.S. patent application Ser. No. 12/189,476, filed on Aug. 11, 2008, U.S. Patent Application No. 61/512,379, filed on Jul. 27, 2011, U.S. patent application Ser. No. 13/401,618, filed on Feb. 21, 2012, and U.S. Patent Application No. 61/622,982, filed on Apr. 11, 2012. As well, related concepts are disclosed in U.S. Pat. No. 9,496,200, which issued Nov. 15, 2016. Each foregoing patent and patent application is hereby incorporated by reference in its entirety as if fully set forth herein, for all purposes.

FIG. 2 also shows a rack-level coolant-distribution unit 10. A coolant-distribution unit is sometimes referred to as a "coolant heat-exchange unit" when it incorporates a heat-exchanger (e.g., a condenser) to reject heat from the coolant passing through the coolant-distribution unit. In the embodiment depicted in in FIG. 2, the coolant-distribution unit 10 can include at least one pump and can also incorporate a reservoir and other components described more fully below, regardless of whether the coolant-distribution unit incorporates a heat exchanger (e.g., a condenser).

In the embodiment shown in FIG. 2, the coolant-distribution unit 10 incorporates a heat exchanger. When a heat exchanger is included within the confines of the coolant-distribution unit 10, as in FIG. 2, the coolant-distribution unit 10 can receive from the collection manifold a vapor-phase (or a saturated mixture of liquid-and-vapor phase) coolant carrying heat absorbed from the servers 12a-n and facilitate transfer of that heat to another medium. As the coolant rejects heat to the other medium, the vapor-phase coolant (or the vapor-portion of the saturated mixture) can condense into a liquid phase. Further, the liquid-phase coolant can reject further heat, making the coolant a sub-cooled liquid. The coolant-distribution unit 10 can return the cooled coolant (sub-cooled or saturated liquid-phase) to the servers via a distribution manifold, allowing the coolant to absorb further heat from the servers.

In other embodiments, a coolant-distribution unit receives liquid coolant (e.g., sub-cooled liquid coolant or saturated liquid coolant) from a heat exchanger positioned outside the confines of the coolant-distribution unit or delivers the heated, vapor-phase (or saturated mixture of vapor-and-liquid phase) coolant to such an external (e.g., outside the confines of the coolant-distribution unit) heat exchanger (not shown). The external heat exchanger cools the coolant (e.g., to sub-cool it or to condense it, or both) before the coolant is again distributed among and through the servers 12a-n).

III. Framework 2: A Secondary Two-Phase Coolant Loop Cooled by a Primary Coolant Loop Similarly, in context of a system for cooling a plurality of racks of servers, a modular cooling system can provide a rack-cooling node for each rack of servers. In FIG. 2, for example, a rack-cooling node can encompass all 42 of the server-cooling nodes 11, and the secondary cooling loop relative to a "rack-cooling node" can pass into, through, and out-from each server-cooling node as described above regarding a "primary cooling loop." In this context, a facility level cooling loop (also sometimes referred to as a "primary cooling loop") can absorb heat from the secondary cooling loop that cools the rack-cooling node.

As described above, modular cooling systems as shown in FIGS. 2 and 3 can provide at least one cooling node for each server in a rack, or the rack of servers can be grouped together to define a rack-level cooling node. In either embodiment, a branch of a closed-loop circuit can circulate coolant through a server (e.g., among several servers) from outside its confines to directly cool a heat-generating component within the server. FIGS. 2 and 3 show embodiments of servers cooled by such a branch of a closed-loop circuit.

Figure 4:
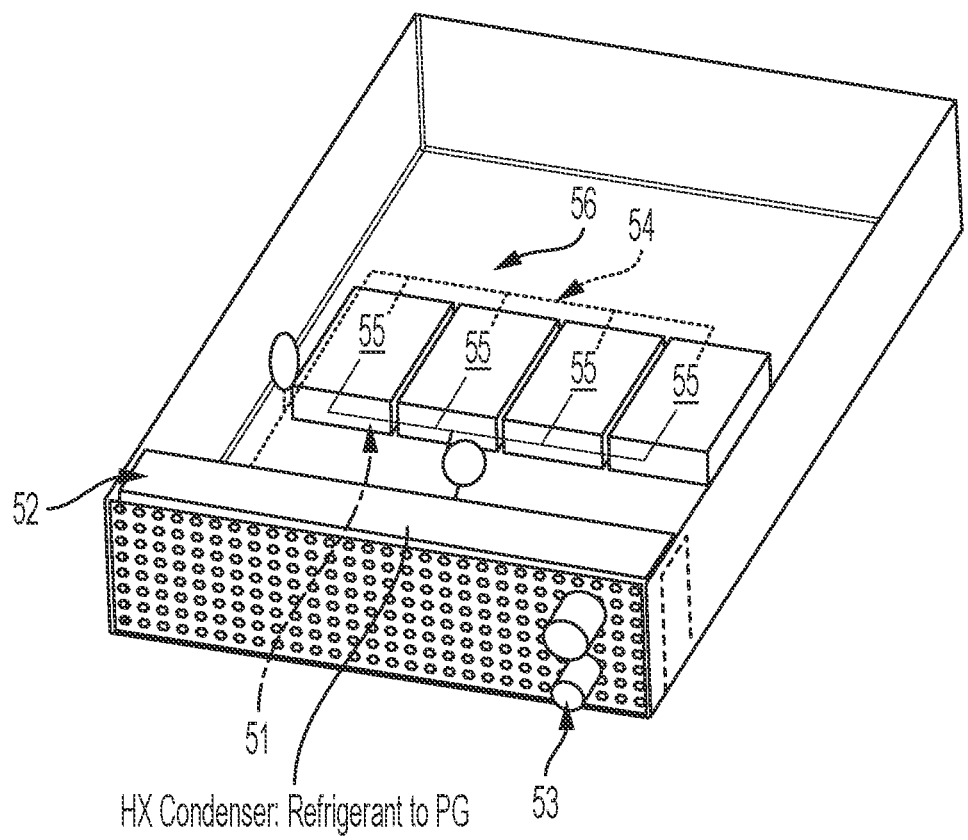
FIG. 4 also illustrates an embodiment of a server cooled by a modular, two-phase cooling system.

Alternatively, as shown in FIG. 4, a cooling node can include a heat exchanger 52 that facilitates a transfer of heat from a secondary coolant loop 54 predominantly positioned within a given heat-generating node 56 (e.g., a server node or a rack node) to a primary coolant loop (not illustrated) predominantly positioned external to the heat-generating node, as with a second framework briefly described above and now described in further detail.

With embodiments based on the second framework, a server (or other heat-generating node) can incorporate a closed-loop cooling circuit 54 contained predominantly within the server 56 as FIG. 4 shows schematically. The closed-loop cooling circuit 54 within the server (a "secondary coolant loop") can be thermally coupled with a primary cooling loop, e.g., by way of a heat exchanger 52 that allows heat to transfer from one cooling loop to the other cooling loop without allowing the coolant in either loop to mix with the coolant in the other loop. In this framework, rather than providing a branch of a primary cooling loop that passes into each server (or other node) as in FIGS. 2 and 3, each cooling node 53 of the primary coolant loop can be thermally coupled with the secondary coolant loop 54 corresponding to a given heat-generating node (e.g., server or rack). For example, a heat exchanger 52 can thermally couple the primary coolant passing through the primary coolant loop with the secondary coolant passing through the secondary coolant loop 54, while preventing the primary coolant from mixing with the secondary coolant.

In such embodiments, the primary coolant passing through the cooling node 53 and/or the secondary coolant being cooled by the cooling node 53 changes phase during the heat-transfer process. For example, the primary coolant can evaporate as it absorbs heat from the secondary coolant (which the secondary coolant absorbed from one or more heat-generating components). Alternatively, the primary coolant can remain in a liquid phase as it absorbs heat from the secondary coolant. Some embodiments that maintain the primary coolant in a liquid phase can have lower complexity compared to embodiments where the primary coolant changes phase. For example, plumbing features for conveying a vapor phase of the primary coolant through a collection manifold and ultimately a condenser might (but does not necessarily) introduce added cost or complexity compared to, for example, systems that incorporate a secondary cooling loop within each server.

Regardless of whether the primary coolant remains in a single phase, the secondary coolant can change phase as it circulates through the secondary coolant loop 54. For example, as with embodiments described above in connection with FIGS. 2 and 3, a portion of the secondary coolant can evaporate as it absorbs heat passing through a component-cooling node 55 (e.g., similar to the component-cooling node 20a, 20b). The vapor-phase coolant (or a saturated mixture of vapor-phase and liquid-phase coolant) in the secondary cooling loop can subsequently pass through a heat-exchanger 52 to reject heat to the primary coolant of the primary cooling loop as it passes through the heat-exchanger, condensing the vapor-phase of the secondary coolant as it passes through the heat-exchanger. In still other embodiments, the secondary coolant remains in a sub-cooled or saturated liquid phase as it absorbs heat passing through the component-cooling node and rejects heat passing through the heat exchanger. In such embodiments, the primary coolant can change phase (e.g., evaporate) as it absorbs heat rejected from the secondary coolant.

As with the first framework, secondary cooling loops under the second framework can also include a distribution manifold 51 to distribute cool coolant to or among one or more cold-plates or other heat-exchange modules 55, as well as a collection manifold 56 to collect heated coolant (that is in a sub-cooled liquid phase, a saturated liquid phase, a saturated mixture of liquid-phase and vapor-phase, a saturated vapor-phase or a superheated vapor-phase) from the one or more cold-plates or other heat-exchange modules 55.

IV. Two-Phase Coolant Loop Embodiments

Features suitable for two-phase coolant loops under either or both the first framework and the second framework are now described with reference to FIGS. 5, 6, 7 and 8.

Figure 5:
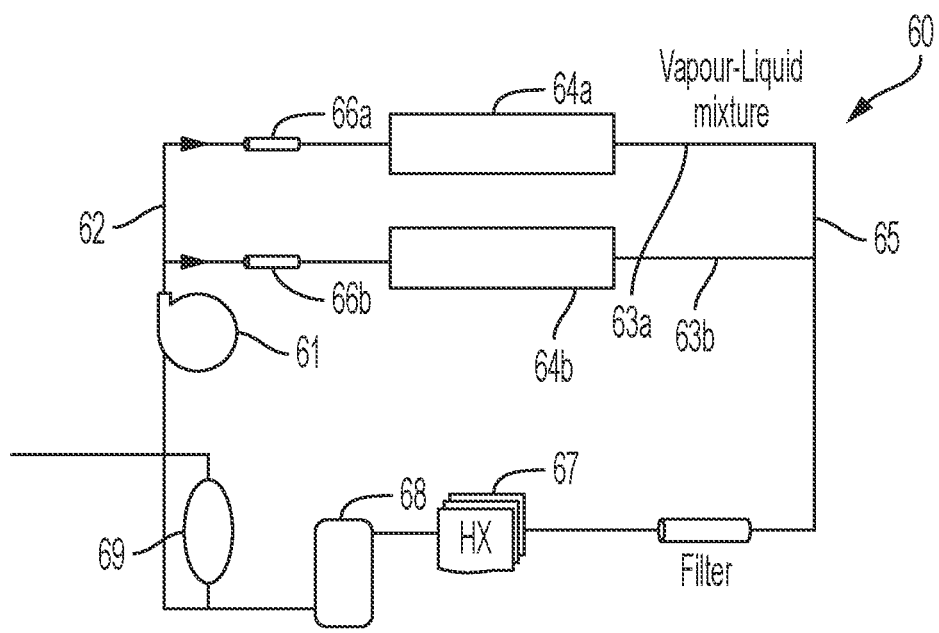
FIG. 5 through FIG. 8 illustrate embodiments of modular, two-phase cooling systems.

FIG. 5 schematically illustrates a modular, two-phase cooling loop 60 suitable for the first framework and the second framework described above. In FIG. 5, a pump 61 conveys sub-cooled liquid coolant to a manifold 62 that divides the flow of coolant, in this embodiment, between two parallel branches 63a, 63b. In each branch 63a, 63b, coolant passes through a flow-regulation valve 66a, 66b, respectively, e.g., an automatic, flow-limiting valve, before entering a respective cooling node (e.g., a cold-plate or other heat-exchanger) 64a, 64b. As the coolant passes through each cooling node 64a, 64b, it absorbs heat and a portion of the coolant evaporates so the coolant exhausts from the respective cooling node as a saturated mixture of liquid-phase and vapor-phase. A collection manifold 65 collects the flow of coolant from each branch 63a, 63b, mixing the flows together. The combined flows of coolant can pass through an optional filter before passing through a heat-exchanger/condenser where the vapor-phase condenses to the liquid-phase as the coolant rejects heat to another medium (not shown in FIG. 6). The liquid-phase coolant exits the heat-exchanger/condenser and enters a reservoir or other buffer chamber 68.

An accumulator 69 positioned between the reservoir and the pump can control the pressure of the coolant as it passes from the reservoir to the pump, ensuring that the coolant enters the pump 61 (and subsequently each cooling node 64a, 64b) at a suitable thermodynamic state. For example, a medium's given thermodynamic state typically is defined by the medium's temperature and pressure. Thus, for a medium at a given temperature, its state can be adjusted by adjusting its pressure. The accumulator can adjust the pressure of the coolant, for example, by separating a volume of the coolant from a chamber filled with a compressible fluid, e.g., nitrogen ($N_2$), using a flexible, compliant bladder or other membrane (not shown). A pressure of the compressible fluid can be adjusted, e.g., increased or decreased, by injecting additional compressible fluid into the chamber or by bleeding a portion of the compressible fluid from the chamber, respectively. As the pressure of the compressible fluid in the accumulator adjusts, the pressure across the bladder or other membrane adjusts by a corresponding amount, adjusting the thermodynamic state of the coolant within the conduit between the reservoir and the pump 61. The pressure can be selected in correspondence with the pressure head imparted by the pump, as well as with the head loss through each segment of conduit, flow transition, and flow-regulation valve, to ensure that coolant entering each cooling node 64a, 64b is at or within a selected threshold range of its saturation pressure and temperature. The accumulator, e.g., by virtue of its resiliently deformable bladder or other membrane, can also damp pressure fluctuations that can arise within the coolant loop 60.

In some embodiments, the flow-control valves 66a, 66b can be configured to balance a flow rate of coolant through each branch 63a, 63b of the cooling loop 60. For example, such valves can be automatically flow-limiting within a selected pressure range. Embodiments of such valves are commercially available from a variety of sources, including for example Griswold Controls® of Irvine, California and Caleffi Hydronic Solutions of Milwaukee, Wisconsin.

According to the first framework described above, the coolant-loop 60 shown in FIG. 6 can correspond to the rack-mounted coolant loop shown in FIG. 2. In this framework, the heat-exchanger/condenser can be incorporated into the coolant-distribution unit 10 and each branch 63a, 63b of the coolant loop can correspond to a given server node 12a-n, and each cooling node 64a, 64b can correspond to one or more heat sources within the corresponding server node 12a-n. Alternatively, according to the second framework, the coolant loop 60 shown in FIG. 5 can correspond to a primary cooling loop or a secondary cooling loop disposed predominantly within each server, or both. For example, when the cooling loop 60 shown in FIG. 6 is a primary cooling loop, each cooling node 64a, 64b shown in FIG. 5 can be one side 53 of a heat-exchanger (e.g., heat exchanger 52 in FIG. 4, or a primary side of a heat exchanger disposed in a coolant-distribution unit 10 in FIG. 2) configured to facilitate heat transfer from a coolant passing through a secondary coolant loop to a coolant circulating through the loop 60 shown in FIG. 5.

Although the cooling nodes 64a, 64b are described in relation to some embodiments herein as "coldplate 1" and "coldplate 2," respectively, the cooling nodes 64a, 64b need not be limited to cold-plates. Rather, depending on the framework, one or more of the cooling nodes 64a, 64b (there may be more than two in some embodiments) can be a heat exchanger configured to facilitate heat transfer from one fluid to another fluid, e.g., one or both illustrated cooling nodes 64a, 64b can represent a heat-transfer interface with another cooling loop under the first framework or the second framework. Similarly, the cooling nodes 74a, 74b, and 84a, 84b shown in FIGS. 6 through 8 also can be a heat exchanger configured to facilitate heat transfer from one fluid to another fluid, and need not be limited solely to cold-plates that transfer heat from a heat-generating component to a coolant.

Alternatively, or additionally, the cooling loop 60 shown in FIG. 5 can be predominantly disposed within a given server, as with the cooling loop shown in FIG. 4, and each cooling node 64a, 64b in FIG. 5 can correspond to a given heat source (e.g., can be analogous to the cooling nodes 55 shown in FIG. 5) within the server. The heat-exchanger/condenser 67 in FIG. 5 can be analogous to the heat exchanger 52 in FIG. 4, facilitating heat transfer from the coolant passing through the secondary loop 56 in FIG. 4 to a coolant passing through the primary loop 53.

Figure 6:
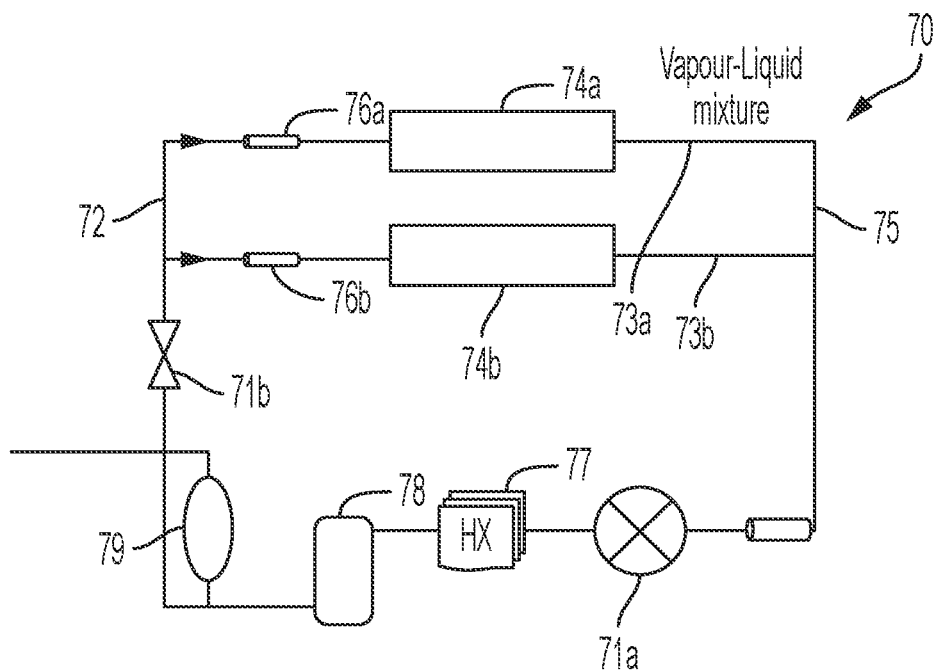

FIG. 6 shows another embodiment of a modular, two-phase cooling loop, similar to the cooling loop shown in FIG. 5. However, unlike the cooling loop in FIG. 5, the loop in FIG. 6 incorporates a compressor 71a and an expansion valve 71b for controlling a phase of coolant entering each cooling node (or cold-plate) 74a, 74b. In the embodiment shown in FIG. 6, the compressor 71a performs thermodynamic work on a vapor-phase of the coolant, and the temperature of the compressed coolant is reduced by rejecting heat as the coolant passes through the heat exchanger 77, condensing the coolant. As the coolant subsequently passes through the expansion valve 71b, its temperature drops through Joule-Thomson cooling and a saturated mixture of coolant enters each branch 73a, 73b from the manifold 72. The coolant subsequently evaporates as it absorbs heat from each heat source at each cooling node 74a, 74b. As with the cooling loop shown in FIG. 5, the cooling loop shown in FIG. 6 can be used as the cooling loop under the first framework described above. As well, like the loop shown in FIG. 5, the cooling loop shown in FIG. 6 can be used as either or both of the primary cooling loop and the secondary cooling loop described under the second framework. As with the loop 60, the cooling loop 70 can include a reservoir or other buffer chamber 78, an accumulator 79, and an optional filter. Also similar to the loop 60, each branch 73a, 73b in the loop 70 can have a flow-regulating valve 76a, 76b to achieve a desired proportion of flow rates among the two or more branches that receive coolant from the manifold 72. A manifold 75 can collect the vapor-liquid mixture from each branch 73a, 73b.

Figure 7:
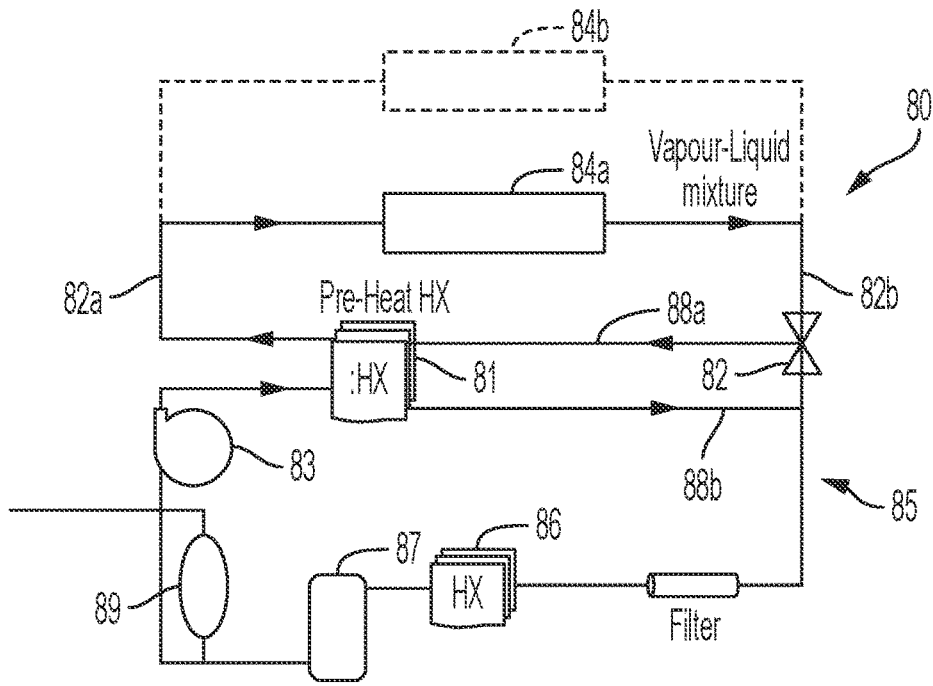
Figure 8:
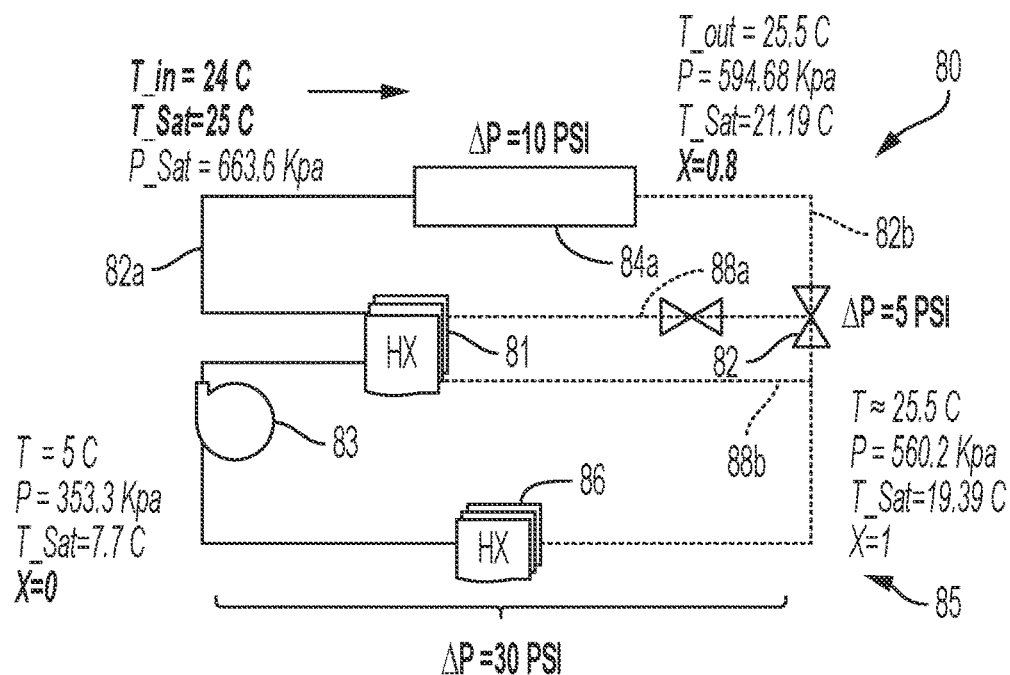

FIGS. 7 and 8 show yet another embodiment of a two-phase cooling loop 80 that controls the coolant's thermodynamic state as it enters a cooling node 84a (or one or more cooling nodes 84a, 84b) by adjusting the coolant's temperature (and/or pressure). FIG. 8 shows the same cooling loop 80 as that shown in FIG. 7 with annotations reflecting a coolant's thermodynamic state at several locations for one particular set of operating conditions. Those of ordinary skill in the art will understand and appreciate that the conditions indicated in FIG. 8 are in no way limiting to the scope of principles described herein. Further, those of ordinary skill in the art will understand that, in FIG. 8, some features shown in FIG. 7 are omitted for clarity of illustration.

In addition to the heat exchanger/condenser 86 that rejects heat from the coolant passing through the cooling loop 80, the loop 80 incorporates a second, pre-heating heat-exchanger 81 and associated conduit and control valve(s) 82. As described above, a thermodynamic state of the coolant in FIG. 7 is adjustable by adjusting a pressure of the coolant with the accumulator 89. An embodiment 80 as shown in FIG. 7 provides another degree-of-freedom for adjusting the thermodynamic state of coolant entering a cooling node 84a, 84b, e.g., by providing a means for controlling temperature of the coolant entering the cooling node. For example, coolant 82a can pass through one side of a pre-heating heat-exchanger 81 after exiting the pump 83 and before entering a cooling node (or a branch of the cooling loop 80). A portion 88a of the coolant 82b that has absorbed heat in the cooling node 84a can be directed to a second side of the pre-heating heat-exchanger 81. A residual portion 85 of the coolant can bypass the heat exchanger 81. The coolant passing through the first side of the heat-exchanger 81 can absorb heat from the heated coolant 88a passing through second side of the heat-exchanger 81, increasing the latent energy in the upstream-flow of coolant 82a before it enters the cooling node. After passing through the heat exchanger 81, the residual portion 85 of coolant can recombine with the portion 88a of coolant directed to the heat exchanger and flow to the condenser 86.

While pre-heating coolant intended to cool a heat source is perhaps counter-intuitive, such pre-heated coolant entering the cooling node can be close to (or at) a saturation state, allowing it to more readily undergo phase transition as it absorbs additional heat in the cooling node 84a, 84b. Accordingly, by pre-heating the coolant 82a, a temperature of the coolant passing through the cooling node 84a, 84b can be approximately uniform across the cooling node from its inlet to its outlet. Without such pre-heating, the coolant entering the cooling node may more likely be in a sub-cooled liquid state, which will impart a relatively larger temperature gradient within the coolant across the cooling node from its inlet to its outlet. In some applications, providing a small or minimal temperature gradient within the coolant across the cooling node 84a, 84b from its inlet to its outlet is particularly desirable. In some embodiments, providing little or no sub-cooling of the liquid coolant entering the cooling node provides a high threshold level of system performance.

The valve 82 in FIG. 8 can be selectively adjusted in correspondence with the coolant's temperature, pressure and flow-rate exiting the pump 83, the coolant's desired thermodynamic state and flow-rate entering the cooling node 84a, 84b, and the coolant's thermodynamic state exiting the cooling node (or similarly, the thermodynamic state of the coolant entering the second side of the pre-heating heat exchanger). For example, control logic can receive sensor data from one or more of the previously indicated locations of the cooling loop 80 (e.g., as in FIG. 8) and can determine a suitable flow-rate of the heated coolant 82b exiting the cooling node that should be directed through the second side of the pre-heating heat-exchanger 81 to ensure the coolant 82a entering the cooling node is at a desired thermodynamic state. The determined flow-rate that should be directed through the pre-heating heat-exchanger 81 may be a fractional portion or a whole portion of the flow-rate exiting the cooling node 84a, 84b in correspondence to a degree of sub-cooling of the coolant that enters the pre-heating heat-exchanger 81. The control logic can transmit a control signal over a communication connection with the controllable valve 82 to adjust the flow-rate of the heated coolant directed through the second-side of the pre-heating heat-exchanger 81. After a suitable timeframe (e.g., several thermal time-constants) during which temperatures of the cooling loop can stabilize in response to the valve's 82 adjustment, the control logic can repeat the process of receiving sensor data and, as may be appropriate, adjusting a valve position. Under some operating conditions, a plurality of such iterations may be appropriate or necessary to ensure coolant entering the cooling node is at a saturated state. Such control logic can be implemented in a general-purpose computing environment as described herein. As with the loops 60, 70, the cooling loop 80 can include a reservoir or other buffer chamber 87, an accumulator 89, and an optional filter. Each branch in the loop 80 can optionally, but need not, have a flow-regulating valve to achieve a desired proportion of flow rates among the two or more cooling nodes 84a, 84b that receive coolant from the manifold 72. A manifold can collect the vapor-liquid mixture from each branch containing a cooling node 84a, 84b.

According to a disclosed aspect, a control system as described can receive real-time information that pertains to the rate of heat dissipated by a heat source, as well as real-time information that pertains to the cooling capacity provided by the cooling node that corresponds to the heat source. Responsive to the received real-time information, the control logic can adjust, for example, the mass-flow rate of coolant through the cooling node to match the cooling capacity of the cooling node to the rate of heat dissipated by the heat source. Similarly, the control system can adjust the mass-flow rate of coolant through the cooling node to provide a desired thermodynamic state of the coolant exiting a given cooling node. In an embodiment, the control system can adjust a pump speed or partially open or close a valve, or both, to control a flow rate of coolant through a given segment of the cooling loop.

Disclosed control logic can be embodied in software, firmware or hardware (e.g., an ASIC). A control unit processor may be a special purpose processor such as an application specific integrated circuit (ASIC), a general purpose microprocessor, a field-programmable gate array (FPGA), a digital signal controller, or a set of hardware logic structures (e.g., filters, arithmetic logic units, and dedicated state machines), and can be implemented in a general computing environment as described herein.

The modular, two-phase cooling loop shown in FIG. 8 is similar to the cooling loop shown in FIG. 5, though only a single cooling node is illustrated in FIG. 8 compared to the two branches 63a, 63b and the corresponding two cooling nodes 64a, 64b shown in FIG. 5 (and shown in dashed line in FIG. 7). That said, a person of ordinary skill in the art will appreciate that the loop 80 shown in FIG. 8 can incorporate a plurality of cooling nodes in parallel or in series with each other as described above, e.g., in connection with FIG. 6, and shown in FIG. 7.

As with the cooling loop 60 shown in FIG. 5, the cooling loop 80 shown in FIGS. 7 and 8 can be used as the cooling loop under the first framework described above. As well, like the loop shown in FIGS. 5 and 6, the cooling loop shown in FIGS. 7 and 8 can be used as either or both of the primary cooling loop and the secondary cooling loop described under the second framework.

V. Two-Phase Cold-Plate Embodiments

In addition to component-cooling nodes described above, FIGS. 9 through 12 illustrate aspects of cooling nodes suitable for cooling one or more sticks of memory (not shown) or other heat-sources mounted to a vertically oriented substrate (e.g., other multi-chip-modules). Also shown in FIGS. 9 through 12 are aspects of coolant distribution manifolds suitable for distributing cool coolant among a plurality of such cooling nodes, as well as coolant collection manifolds suitable for collecting heated coolant (e.g., in a vapor-phase, a liquid-phase, or a saturated mixture thereof) from among a plurality of such cooling nodes. Other embodiments of such cooling nodes are described by way of example in co-pending U.S. patent application Ser. No. 17/201,394, filed Mar. 15, 2021, which is hereby incorporated in its entirety as if fully set forth herein, for all purposes.

Figure 9:
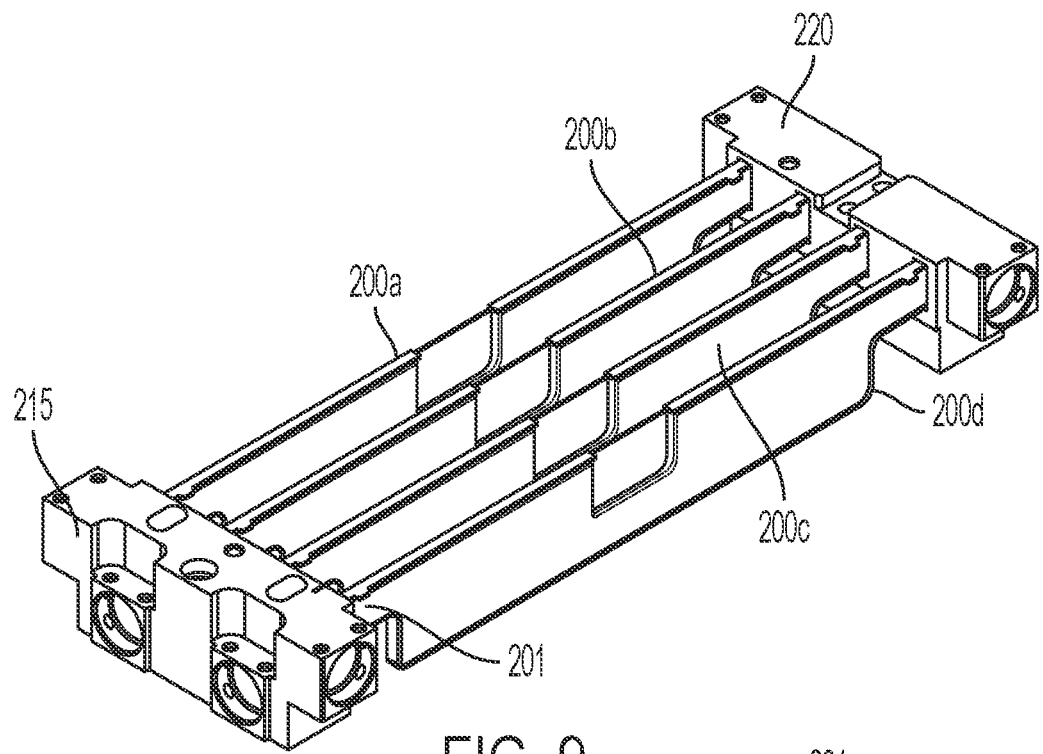
FIGS. 9 through 12 illustrate aspects of cooling node embodiments.
Figure 10:
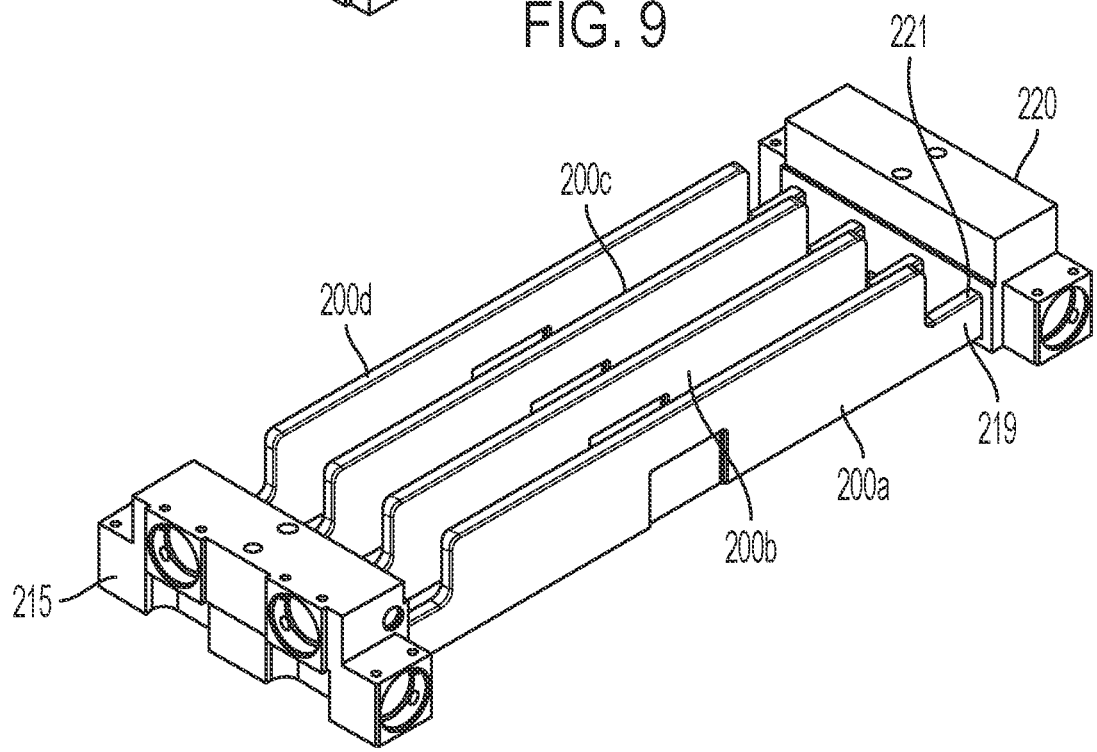
Figure 11:
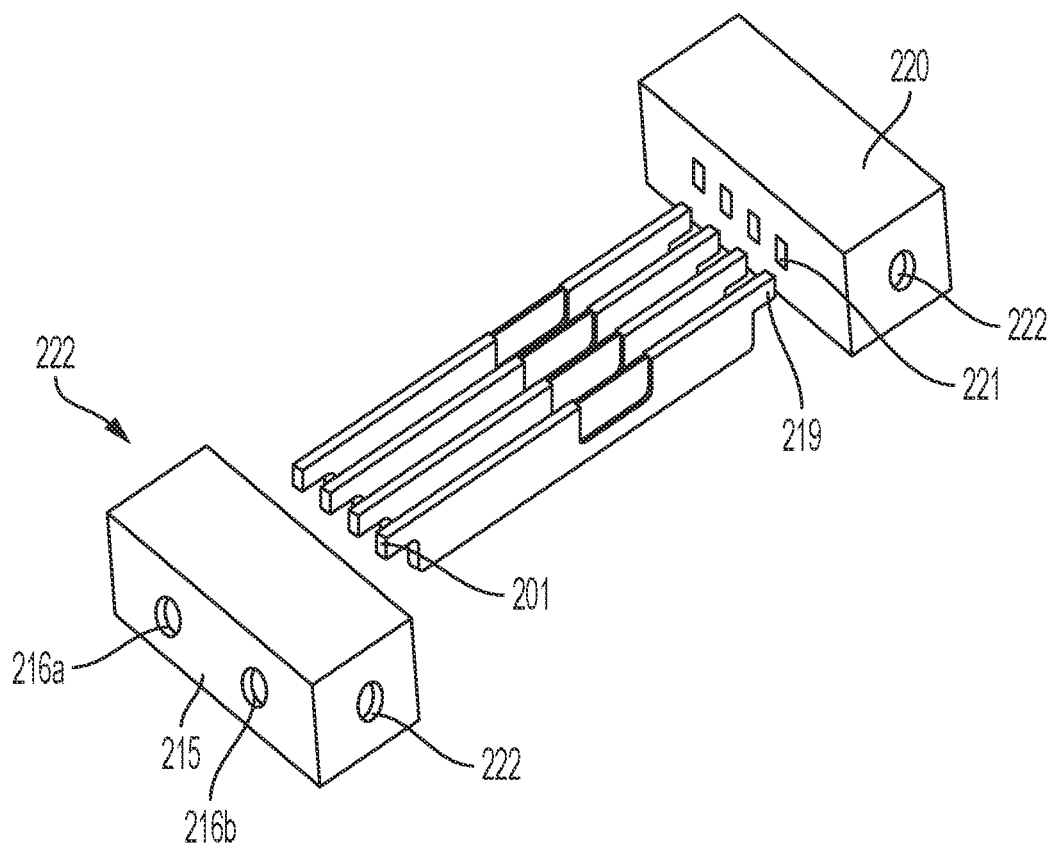

FIGS. 9 and 10 show four cooling nodes 200a, 200b, 200c, 200d spanning from a distribution manifold 215 to a collection manifold 220. Each cooling node has an inlet 201 (FIG. 11) fluidically coupled with an outlet (not shown) from the distribution manifold 215 and an outlet 219 fluidically coupled with an inlet 221 (FIG. 11) to the collection manifold 220. FIG. 11 shows an exploded view of the assembly depicted in FIG. 10, and FIG. 12 shows an exploded view of one of the cooling nodes 200a-d.

Figure 12:
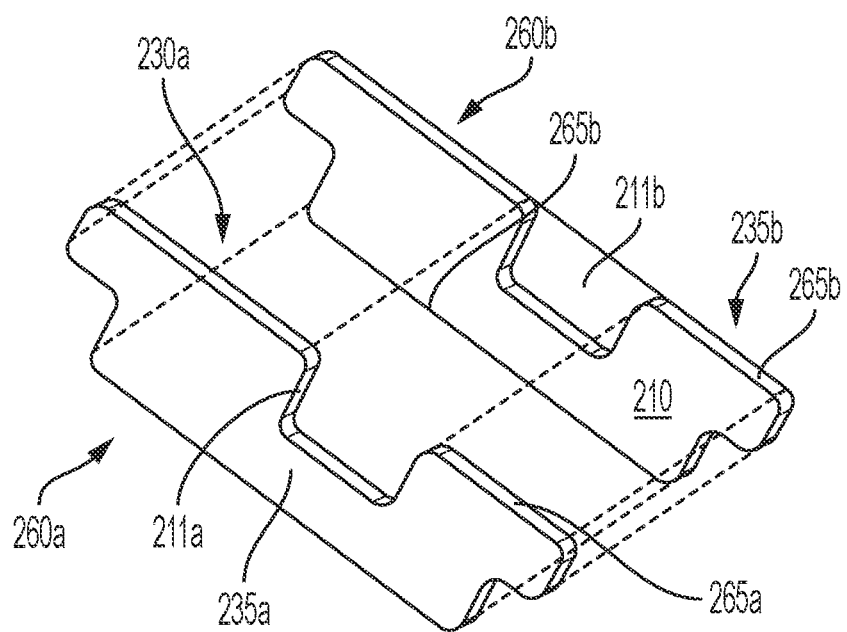

As shown in the exploded view of FIG. 12, the cooling node 200 can be constructed from a first shell member 260a and a second shell member 260b sealably affixed with each other. For example, the first shell member 260a can define the wall 230a having an external major surface 235a and a corresponding outer periphery. A peripheral flange 265a can be oriented transversely relative to the external major surface 235a and positioned adjacent the outer periphery of the external major surface, as shown in FIG. 12. The peripheral flange 265a can be sealably affixed with the second shell member 260b, as by brazing, soldering, welding, or other fusing technique, or the peripheral flange and the second shell member can be adhesively secured with each other, as by applying an adhesive material in a joint between the peripheral flange and the second shell member.

As shown in the exploded view in FIG. 12, the second shell member 260b can define a region that is complementarily configured relative to the peripheral flange 265a (or another feature) defined by the first shell member 260a, allowing the first shell member 260a and the second shell member 260b to be sealably affixed with each other. For example, the second shell member 260b defines an outer periphery and a corresponding peripheral flange 265b extending around the outer periphery of the second shell member. The peripheral flange 265b extending around the outer periphery of the second shell member can be sealably affixed with the peripheral flange 265a of the first shell member 260a, as shown for example in FIG. 11. More specifically, the peripheral flanges 265a, 265b can form a lap joint. The lap joint can be brazed, or otherwise fused, or adhered, sealably affixing the peripheral flanges, and thus the first and second shell members 260a, 260b together.

The first shell member, the second shell member, or both, may be constructed from a thermally conductive material, such as, for example, an alloy of copper, an alloy of aluminum, a thermally-conductive polymer or a thermally-conductive composite material. In some embodiments, each shell member 260a, 260b is stamped from a substantially planar sheet of material, e.g., copper. For example, the recess 221b in the second shell member 260b defined by the peripheral flange 265b and the second wall 230b can be formed by die-stamping a sheet of material. A periphery of the recess (or boss) 211b can mate with the complementarily configured notch 211a, providing additional stiffness to the major surfaces of each shell member 260a, 260b. When assembled together as shown, for example, in FIG. 11, the shell members can define an interior chamber 210. As coolant passes through the interior chamber, it can boil as it absorbs heat from the memory devices or other heat-generating components in thermal contact with the external major surfaces 235a, 235b. In some embodiments, one or both manifolds 215, 220 also are in thermal contact with a heat dissipating component and facilitate cooling of such heat dissipating component by transferring heat to the coolant as it passes through the manifold passages.

The distribution manifold 215, the collection manifold 220, or both, can be configured to fluidically couple in parallel with other portions of a two-phase cooling loop as described above. For example, the distribution manifold 215 has a first inlet 216a and a second inlet 216b (FIG. 11) that each receives coolant (in a liquid-phase or a saturated state) from a cooling loop (not shown, but analogous to the cooling loops described above). The distribution manifold 215 also defines two internal passageways, one corresponding to the first inlet 216a and one corresponding to the second inlet 216b, each being configured to convey coolant to one or more of the cooling nodes 200a-d shown in FIGS. 10 through 13. For example, each internal passageway can have a primary passage and one or more branches from the primary passage. Each branch can fluidically couple a corresponding outlet from the distribution manifold 215 with the corresponding primary passage associated with that outlet. In addition to providing a branch from the primary passage to a cooling-node outlet, the manifold 215 also provides an outlet 222 corresponding to each internal passageway that allows a portion of the cool coolant that enters each manifold inlet 216a, b to exhaust from the manifold 215 and to flow to another cooling node (e.g., a cold-plate positioned on a processing unit, another coolant distribution manifold, etc.). In some embodiments, one or both outlets 222 can be plugged (e.g., when a given cooling loop has no cooling nodes downstream of the distribution manifold).

The collection manifold 220 is similarly configured. Each inlet 221 to the collection manifold from a corresponding cooling node 200a-d fluidically couples with a primary passageway (not shown) through the collection manifold. As well, the collection manifold 220 has an inlet 222 to receive heated coolant from another cooling node, allowing heated coolant from each cooling node 200a-d to mix with heated coolant from the other cooling node (e.g., a cold-plate positioned on a processing unit, another coolant distribution manifold, etc.) before exhausting from the collection manifold. In some embodiments, the inlet 222 can be plugged (e.g., when a given cooling loop has no cooling nodes upstream of the collection manifold).

VI. Computing Environments

Figure 13:
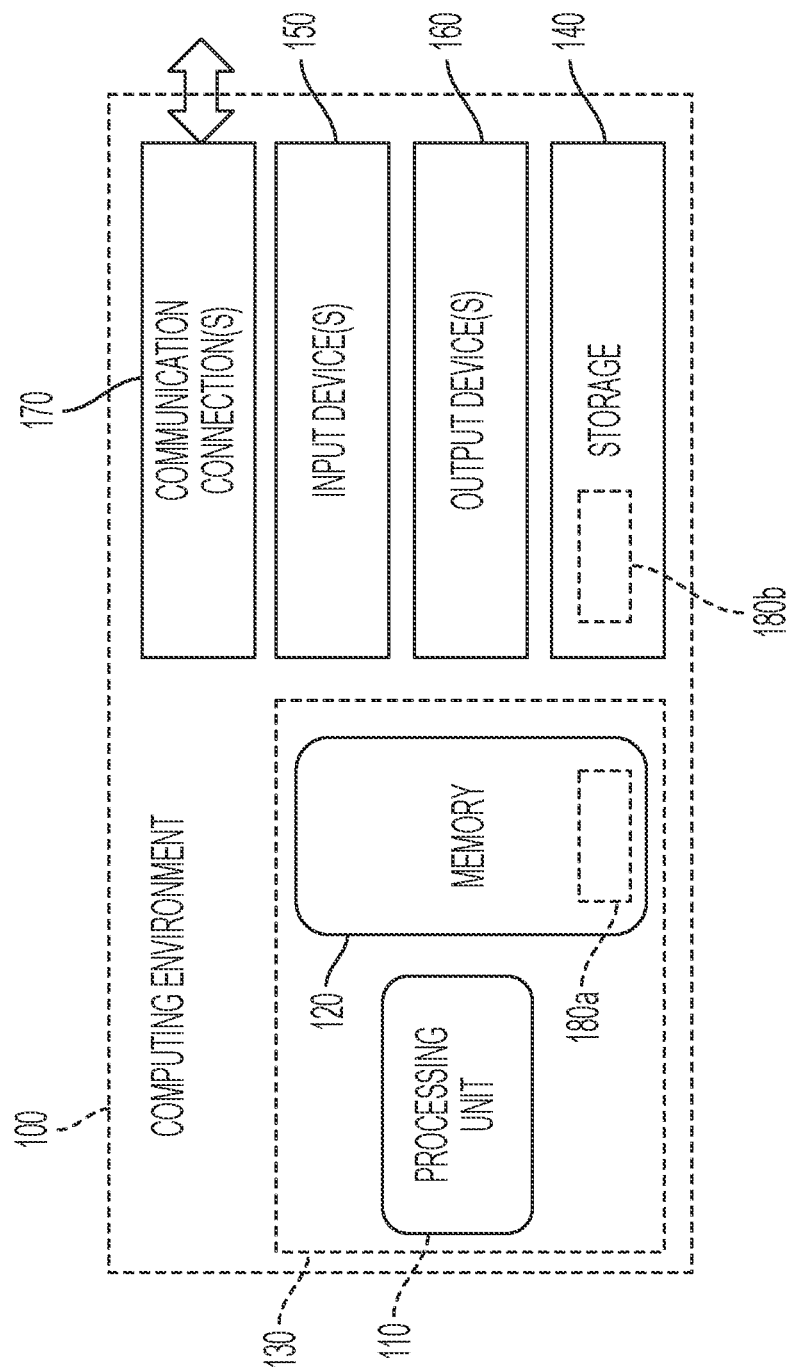

FIG. 13 illustrates a generalized example of a suitable computing environment 100 in which described methods, embodiments, techniques, and technologies relating, for example, to maintaining a temperature of a logic component and/or a power unit below a threshold temperature can be implemented. The computing environment 100 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and/or handheld devices (e.g., a mobile-communications device, e.g., a so-called "smartphone"), multiprocessor systems, microprocessor-based or programmable consumer electronics, embedded platforms, network computers, minicomputers, mainframe computers, smartphones, tablet computers, data centers, audio appliances, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 100 includes at least one central processing unit 110 and a memory 120. In FIG. 13, this most basic configuration 130 is included within a dashed line. The central processing unit 110 executes computer-executable instructions and may be a real or a virtual processor. In a multi-processing system, or in a multi-core central processing unit, multiple processing units execute computer-executable instructions (e.g., threads) to increase processing speed and as such, multiple processors can run simultaneously, despite the processing unit 110 being represented by a single functional block. A processing unit can include an application specific integrated circuit (ASIC), a general purpose microprocessor, a field-programmable gate array (FPGA), a digital signal controller, or a set of hardware logic structures arranged to process instructions.

The memory 120 may be volatile memory (e.g., registers, cache, RAM), non-volatile memory (e.g., ROM, EEPROM, flash memory, etc.), or some combination of the two. The memory 120 stores software 180a that can, for example, implement one or more of the technologies described herein, when executed by a processor.

A computing environment may have additional features. For example, the computing environment 100 includes storage 140, one or more input devices 150, one or more output devices 160, and one or more communication connections 170. An interconnection mechanism (not shown) such as a bus, a controller, or a network, interconnects the components of the computing environment 100. Typically, operating system software (not shown) provides an operating environment for other software executing in the computing environment 100, and coordinates activities of the components of the computing environment 100.

The store 140 may be removable or non-removable, and can include selected forms of machine-readable media. In general machine-readable media includes magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information and which can be accessed within the computing environment 100. The storage 140 can store instructions for the software 180b, which can implement technologies described herein.

The store 140 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 150 may be any one or more of the following: a touch input device, such as a keyboard, keypad, mouse, pen, touchscreen, touch pad, or trackball; a voice input device, such as a microphone transducer, speech-recognition software and processors; a scanning device; or another device, that provides input to the computing environment 100. For audio, the input device(s) 150 may include a microphone or other transducer (e.g., a sound card or similar device that accepts audio input in analog or digital form), or a computer-readable media reader that provides audio samples to the computing environment 100.

The output device(s) 160 may be any one or more of a display, printer, loudspeaker transducer, DVD-writer, or another device that provides output from the computing environment 100.

The communication connection(s) 170 enable communication over or through a communication medium (e.g., a connecting network) to another computing entity. A communication connection can include a transmitter and a receiver suitable for communicating over a local area network (LAN), a wide area network (WAN) connection, or both. LAN and WAN connections can be facilitated by a wired connection or a wireless connection. If a LAN or a WAN connection is wireless, the communication connection can include one or more antennas or antenna arrays. The communication medium conveys information such as computer-executable instructions, compressed graphics information, processed signal information (including processed audio signals), or other data in a modulated data signal. Examples of communication media for so-called wired connections include fiber-optic cables and copper wires. Communication media for wireless communications can include electromagnetic radiation within one or more selected frequency bands.

Machine-readable media are any available media that can be accessed within a computing environment 100. By way of example, and not limitation, with the computing environment 100, machine-readable media include memory 120, storage 140, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions. The instructions can program one or more data processing components (generically referred to here as a "processor") to perform a processing operations described above, including estimating, computing, calculating, measuring, adjusting, sensing, measuring, filtering, addition, subtraction, inversion, comparisons, and decision making (such as by the control unit 52). In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

For sake of brevity throughout this disclosure, computing-environment components, processors, interconnections, features, devices, and media are generally referred to herein, individually, as a "logic component."

VII. Terminology

As used herein, the terms "heat sink" and "heat exchanger" mean a device configured to transfer energy to or from a fluid, as through convection (i.e., a combination of conduction and advection), phase change of the fluid, or both, or to or from another medium as through conduction or radiation heat transfer. Although those terms are sometimes used interchangeably depending on context, the term "heat exchanger" is more often used in the art to refer to a device that transfers heat from one fluid to another fluid, while the term "heat sink" often connotes a device e.g., a component (e.g., having one or more extended heat-transfer surfaces, or "fins") or a medium (e.g., the atmosphere) that promotes the receipt-of-heat by a fluid from a heat source (e.g., an electronics component that generates heat during operation, products of combustion or another exothermic reaction between or among solid, liquid, and/or gaseous reactants, or even fuel rods in a nuclear reactor).

A "heat exchange module" can be a stand-alone heat exchanger or heat sink, or a "heat exchange module" can include a heat exchanger (or heat sink) assembled in combination with one or more other components to define a separately identifiable and functional module, or subassembly. For example, as described more fully below, a heat exchange module can include a duct or a housing in combination with a heat exchanger. As well, a heat exchange module can include a heat-exchanger-and-pump assembled together with an integrated housing, together with any associated seals, gaskets and/or couplers.

The term "cold-plate" usually refers to a special class of "heat sink" that facilitates the transfer of heat from a heat source to a fluid (e.g., a gas, a liquid, or a saturated mixture of the two), although depending on context, the term "cold-plate" can also refer to a "heat exchange module" when at least a portion of the module is configured to facilitate the transfer of heat from a heat source to a fluid. In the context of a rack-mountable server having a plurality of heat-dissipating devices (e.g., microprocessors, chipsets, memory, graphics components, voltage regulators), a cold-plate 20a, 20b (FIG. 3) can include a single-phase or a two-phase (or a mixed-phase) heat exchange module for cooling the respective devices. A two-phase (or a mixed-phase) heat exchange module or cold-plate is sometimes referred to in the art as an "evaporator."

As used herein, the term "node" means an identifiable component (or an identifiable group of components) within a system and the term "cooling node" means an identifiable component (or an identifiable group of components) that absorb(s) heat from an external source (e.g., that cools the external heat source).

As used herein, "phase" refers to a thermodynamic state of a substance, e.g., a liquid phase, a gas phase, a solid phase, or a saturated mixture of liquid and gas. As used herein, a "single-phase" heat exchange module refers to a heat exchange module in which the working fluid undergoes little or no net change of phase, remaining in substantially the same phase (e.g., a liquid) as the fluid passes through the heat exchange module. As used herein, a "two-phase" heat exchange module refers to a heat exchange module in which the working fluid undergoes a partial or a whole change of phase (e.g., evaporation of a liquid to a gas phase or condensation of a gas to a liquid phase) as the fluid passes through the heat exchange module.

VIII. Other Embodiments

The previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

For example, additional pertinent concepts are described in further detail in the one or more of U.S. Pat. Nos. 9,496,200, 9,052,252, 10,364,809, and 10,365,667, as well as U.S. Patent Application Publication No. 2015/0083368, co-pending U.S. patent application Ser. No. 16/158,227 and co-pending U.S. patent application Ser. No. 17/582,987. Each patent application, patent publication, issued patent and non-patent literature referred to throughout this specification is hereby incorporated in its entirety as if set forth herein in full, for all purposes.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of embodiments of disclosed principles that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application, including the following original claims, or presented in any application claiming benefit of or priority from this application.

We currently claim:

1. A two-phase coolant loop for cooling one or more heat-generating components, the coolant loop comprising:
    a pump configured to urge a coolant to circulate through the coolant loop;
    a heat-exchanger configured to receive the coolant in a sub-cooled state and to transfer heat to the sub-cooled coolant to increase a temperature of the sub-cooled coolant to a selected temperature;
    a cooling branch fluidly coupled with the heat-exchanger to receive the coolant at the selected temperature from the heat-exchanger, the cooling branch having a cooling node configured to transfer heat from a heat source to the coolant passing through the corresponding cooling branch, wherein the coolant passing through at least one of the cooling nodes boils, generating a saturated mixture of vapor-phase and liquid-phase coolant;
    a first fluid coupling from the cooling node to the heat-exchanger configured to convey a selected first portion of the saturated mixture of vapor-phase and liquid-phase coolant to the heat exchanger to provide the heat transferred to the sub-cooled coolant to increase the temperature of the sub-cooled coolant to the selected temperature, the first fluid coupling further configured to convey a residual portion of the saturated mixture of vapor-phase and liquid-phase coolant past the heat exchanger and to recombine the selected first portion of the coolant downstream of the heat exchanger with the residual portion of the coolant, providing a recombined flow of heated coolant; and
    a condenser configured to receive the recombined flow of heated coolant from the first fluid coupling and to reject heat from the recombined flow of heated coolant to another medium, providing a sub-cooled flow of coolant; and
    a second fluid coupling from the condenser to the pump, such that the pump receives the sub-cooled flow of coolant.

2. The two-phase coolant loop according to claim 1, wherein at least one of the heat-generating components comprises a server and wherein the heat source comprises a heat-generating electronic device in the server, wherein the cooling branch extends into, through, and out-from the server, and wherein the cooling node comprises a cold plate configured to receive heat generated by the heat-generating electronic device.

3. The two-phase coolant loop according to claim 2, wherein the heat-generating electronic device comprises processing unit, a memory device, or both.

4. The two-phase coolant loop according to claim 1, wherein at least one of the heat-generating components comprises a plurality of rack-mounted servers, each server the plurality of rack-mounted servers having one or more heat-generating electronic devices, wherein the cooling branch extends into, through, and out from at least one of the servers, and wherein the cooling node comprises a cold plate configured to receive heat generated by at least one of the one or more heat-generating electronic devices corresponding to the at least one of the servers.

5. The two-phase coolant loop according to claim 4, wherein the cooling branch comprises a first cooling branch and wherein the coolant loop comprises a second cooling branch, wherein the first cooling branch extends into, through, and out-from a corresponding one of the plurality of rack-mounted servers and wherein the second branch extends into, through, and out-from a corresponding other one of the plurality of rack-mounted servers.

6. The two-phase coolant loop according to claim 1, wherein at least one of the heat-generating components comprises a plurality of rack-mounted servers and wherein the heat source comprises a secondary cooling loop configured to remove heat from the plurality of rack-mounted servers by circulating a secondary cooling medium through the secondary cooling loop, wherein the coolant comprises a primary cooling medium and the cooling node configured to transfer heat from the heat source comprises an evaporator configured to transfer heat from the secondary cooling medium to the primary cooling medium.

7. The two-phase coolant loop according to claim 1, wherein at least one of the heat-generating components comprises a server having one or more heat-generating electronic devices, wherein the heat source comprises at least one of the one or more heat-generating electronic devices, wherein the other medium comprises a primary cooling medium circulating through a primary cooling loop and the condenser is configured to reject heat from the recombined flow of heated coolant to the primary cooling medium.

8. The two-phase coolant loop according to claim 1, further comprising:
    a control valve fluidly coupled with the cooling branch having a cooling node configured to receive and separate the saturated mixture of vapor-phase and liquid-phase coolant into a selectable first portion and a residual portion.

9. The two-phase coolant loop according to claim 1, further comprising:
    an accumulator configured to adjust the pressure of the coolant fluidly coupled with the condenser to receive the sub-cooled flow of the coolant; and
    a fluid coupling from the accumulator to the pump, such that the pump receives the sub-cooled flow of coolant at an adjusted pressure.

* * * * *